(12) United States Patent
Koda

(10) Patent No.: US 11,698,276 B2
(45) Date of Patent: Jul. 11, 2023

(54) CAPACITANCE SENSOR

(71) Applicant: AISIN CORPORATION, Kariya (JP)

(72) Inventor: Satoshi Koda, Kariya (JP)

(73) Assignee: AISIN CORPORATION, Kariya (JP)

( * ) Notice: Subject to any disclaimer, the term of this patent is extended or adjusted under 35 U.S.C. 154(b) by 228 days.

(21) Appl. No.: 17/311,498

(22) PCT Filed: Dec. 9, 2019

(86) PCT No.: PCT/JP2019/048152
§ 371 (c)(1),
(2) Date: Jun. 7, 2021

(87) PCT Pub. No.: WO2020/122030
PCT Pub. Date: Jun. 18, 2020

(65) Prior Publication Data
US 2022/0018688 A1     Jan. 20, 2022

(30) Foreign Application Priority Data

Dec. 10, 2018  (JP) .............................. JP2018-230679
Dec. 10, 2018  (JP) .............................. JP2018-230680

(51) Int. Cl.
*G01D 5/24*     (2006.01)
*G01R 27/26*    (2006.01)
(Continued)

(52) U.S. Cl.
CPC ........... *G01D 5/24* (2013.01); *G01R 27/2605* (2013.01); *H03K 17/955* (2013.01); *B60R 25/01* (2013.01);
(Continued)

(58) Field of Classification Search
CPC ........ G01R 27/00; G01R 27/02; G01R 27/26; G01R 27/2605; G01D 5/00; G01D 5/12;
(Continued)

(56) References Cited

U.S. PATENT DOCUMENTS 6,864,691 B2 *  3/2005  Palata ................ G01R 27/2605
                                                       324/672
7,015,705 B2 *  3/2006  Inaba ................. G01R 27/2605
                                                       324/76.16

(Continued)

FOREIGN PATENT DOCUMENTS

JP           2018-44917 A       3/2018

OTHER PUBLICATIONS

International Search Report dated Feb. 10, 2020 in PCT/JP2019/048152 filed on Dec. 9, 2019, 3 pages.

*Primary Examiner* — Hoai-An D. Nguyen
(74) *Attorney, Agent, or Firm* — Oblon, McClelland, Maier & Neustadt, L.L.P.

(57) ABSTRACT

A capacitance sensor includes a switch control unit that performs a first switching process that turns on a first switch and then repeatedly performs a second switching process that complementarily switches off and on second and third switches that are respectively connected to second and third capacitors; an obtaining unit that calculates, as a sensor output value, a number of times the second switching process is repeated until a magnitude relationship reverses between an intermediate potential and a reference potential; a calculation unit that calculates a sensor output corrected value obtained by correcting the sensor output value such that a resolution becomes uniform; and a determination unit that determines whether a detection target exists from a magnitude relationship between a sensor output difference value and a determination threshold value.

5 Claims, 9 Drawing Sheets

(51) Int. Cl.
*B60R 25/01* (2013.01)
*H03K 17/955* (2006.01)
*E05F 15/60* (2015.01)
*E05F 15/73* (2015.01)
*B60R 25/20* (2013.01)

(52) U.S. Cl.
CPC ............... *B60R 25/20* (2013.01); *E05F 15/60* (2015.01); *E05F 15/73* (2015.01); *E05Y 2201/434* (2013.01); *E05Y 2400/40* (2013.01); *E05Y 2400/86* (2013.01); *E05Y 2900/531* (2013.01); *E05Y 2900/546* (2013.01)

(58) Field of Classification Search
CPC . G01D 5/14; G01D 5/24; B60R 25/00; B60R 25/01; B60R 25/20; B60R 25/2054; E05F 15/00; E05F 15/60; E05F 15/70; E05F 15/73; E05Y 2201/00; E05Y 2201/40; E05Y 2201/43; E05Y 2201/434; E05Y 2400/00; E05Y 2400/10; E05Y 2400/30; E05Y 2400/40; E05Y 2400/80; E05Y 2400/85; E05Y 2400/852; E05Y 2400/856; E05Y 2400/858; E05Y 2400/86; E05Y 2900/00; E05Y 2900/50; E05Y 2900/53; E05Y 2900/531; E05Y 2900/546; G01B 7/00; G01V 3/00; G01V 3/08; H03K 17/00; H03K 17/94; H03K 17/945; H03K 17/955

USPC .................................. 324/600, 649, 658, 686
See application file for complete search history.

(56) References Cited

U.S. PATENT DOCUMENTS

| | | | | |
|---|---|---|---|---|
| 7,768,272 | B2* | 8/2010 | Kato | H03K 17/955 324/672 |
| 8,264,244 | B2* | 9/2012 | Lin | G01D 5/24 324/658 |
| 8,779,783 | B1* | 7/2014 | Liepold | G06F 3/016 324/684 |
| 10,921,938 | B2* | 2/2021 | Wang | G06F 3/0418 |
| 11,293,961 | B2* | 4/2022 | Kurachi | H03K 17/962 |
| 2008/0122454 | A1* | 5/2008 | Kato | G01D 3/032 324/661 |
| 2008/0150553 | A1* | 6/2008 | Yakabe | H04R 3/00 324/686 |
| 2008/0252303 | A1* | 10/2008 | Kato | H03K 17/955 324/661 |
| 2012/0105079 | A1* | 5/2012 | Khanna | G01P 15/125 324/658 |
| 2014/0091815 | A1* | 4/2014 | Suwald | G01R 27/2605 324/658 |
| 2019/0278401 | A1* | 9/2019 | Wang | G06F 3/044 |

\* cited by examiner

| Resolution | Correction Coefficient (Resolution) | Capacitance | | |
|---|---|---|---|---|
| | | Variation Amount | Sensor Output Value (AD Value) | Sensor Output Corrected Value (Sensor Output Value × Correction Coefficient) |
| 0.5pF/LSB | 0.5 | 10pF | 20LSB | 10LSB (20LSB×0.5) |
| 1pF/LSB | 1 | 10pF | 10LSB | 10LSB (10LSB×1) |
| 5pF/LSB | 5 | 10pF | 2LSB | 10LSB (2LSB×5) |

Fig.14

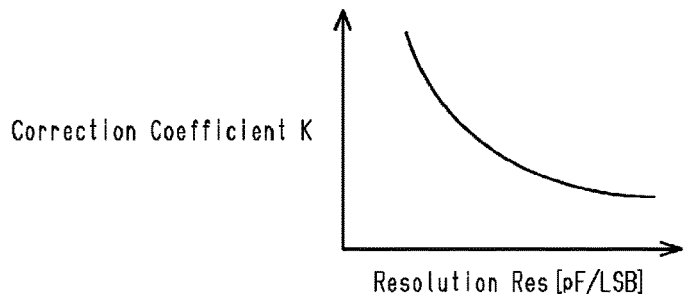

Fig.15

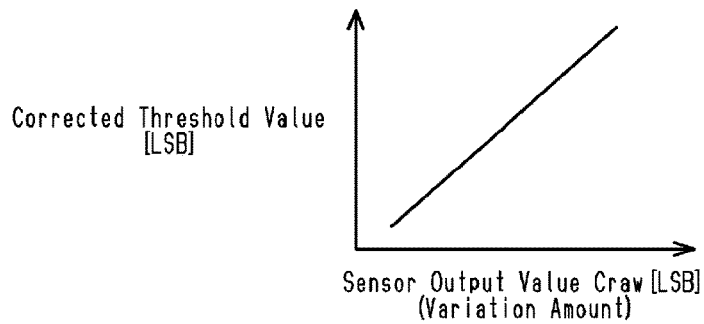

Fig.16

| Resolution | Correction Coefficient (1/Resolution) | Capacitance | | Determination Threshold Value | |
|---|---|---|---|---|---|
| | | Variation Amount | Sensor Output Value (AD Value) | Prior to Correction | Subsequent to Correction (Determination Threshold Value × Correction Coefficient) |
| 0.5pF/LSB | 2 | 10pF | 20LSB | 10LSB | 20LSB (Threshold Value 10 LSB × 2) |
| 1pF/LSB | 1 | 10pF | 10LSB | 10LSB | 10LSB (Threshold Value 10 LSB × 1) |
| 5pF/LSB | 0.2 | 10pF | 2LSB | 10LSB | 2LSB (Threshold Value 10 LSB × 0.2) |

CAPACITANCE SENSOR

TECHNICAL FIELD

The present invention relates to a capacitance sensor.

BACKGROUND ART

Patent Document 1 describes a conventional capacitance sensor. The capacitance sensor includes a first capacitor and a second capacitor connected to the first capacitor. The capacitance of the second capacitor varies depending on the proximity of an object to the second capacitor. The capacitance sensor further includes a first switch that initializes the first capacitor, a second switch arranged between the first and second capacitance sensors, a third switch that initializes the second capacitor, and a control circuit. After the first switch is operated to initialize the first capacitor, the control circuit performs a switch operation including an operation of the second switch and an operation of the third switch and obtains an intermediate potential between the first and second capacitors. Further, a controller obtains the number of times the switch operation is performed when the intermediate potential is greater than a reference potential (i.e., obtains the number of detections). The number of detections correlates with the capacitance that can be discharged by the second capacitor with a single switch operation (i.e., correlates with the capacitance of the second capacitor). Thus, the capacitance of the second capacitor is detected by obtaining the number of detections.

The control circuit obtains intermediate potentials at multiple points in time through each switch operation. Further, the controller obtains the number of detections from multiple intermediate potentials. Such a configuration improves the accuracy of obtaining the number of detections and the accuracy of detecting the capacitance of the second capacitor even if the intermediate potentials include noise.

The capacitance of the second capacitor, which is correlated with the number of detections, varies depending on the proximity of an object to the second capacitor. Thus, the capacitance sensor is used to, for example, determine whether a detection target exists from a magnitude relationship between a variation amount of the number of detections and a threshold value.

Even in an initial state where no detection target exists, the capacitance of the second capacitor changes under the influence of a parasitic capacitance included in the capacitance of the second capacitor. Thus, the discharge capacitance of the second capacitor in a single switch operation changes depending on the parasitic capacitance. This may vary the number of detections and lower the accuracy of detecting the capacitance of the second capacitor. This may lower the accuracy of determining whether the detection target exists, for example, determining whether the user has approached the second capacitor or whether the user has performed operation.

As shown in FIGS. 20A and 20B, it is assumed that capacitance $C11$ of a first capacitor 91 is 100 [pF], capacitance $C12$ of a second capacitor 92 including a parasitic capacitance in the initial state is 5 [pF], and a variation amount $\Delta C12$ of the capacitance $C12$ obtained when a detection target exists is 5 [pF]. The number of detections in this case (hereinafter referred to as a capacitance count value CN[LSB]) and the like will now be described.

A capacitance count value CN0 in the initial state as shown in FIG. 20A is represented by the following equation.

Capacitance count value $CN0=100/5=20$ [LSB]

A capacitance count value CN1 in the state where a detection target exists as shown in FIG. 20B is represented by the following equation.

Capacitance count value $CN1=100/(5+5)=10$ [LSB]

In this case, a variation amount $\Delta CN$ of the capacitance count value CN, which is needed to determine whether the detection target exists, is represented by the following equation.

Variation amount $\Delta CN=|CN1-CN0|=|0-20|=10$ [LSB]

That is, the capacitance sensor detects the variation amount $\Delta CN12$ (5 [pF]), which is needed to determine whether the detection target exists, as the variation amount $\Delta CN$ (10 [LSB]). Thus, a resolution Res [pF/LSB] is represented by the following equation.

Resolution $Res=\Delta C12/\Delta CN=5/10=0.5$ [pF/LSB]

FIGS. 21A and 21B show the number of detections (capacitance count value CN[LSB]) and the like obtained when only the capacitance C12 including the parasitic capacitance in the initial state of the second capacitor 92 is changed to 20 [pF]. The number of detections and the like will now be described.

The capacitance count value CN0 in the initial state as shown in FIG. 21A is represented by the following equation.

Capacitance count value $CN0=100/20=5$ [LSB]

The capacitance count value CN1 in the state where a detection target exists as shown in FIG. 21B is represented by the following equation.

Capacitance count value $CN1=100/(20+5)=4$ [LSB]

In this case, the variation amount $\Delta CN$ of the capacitance count value CN, which is needed to determine whether the detection target exists, is represented by the following equation.

Variation amount $\Delta CN=|CN1-CN0|=|4-5|=1$ [LSB]

That is, the capacitance sensor detects the variation amount $\Delta CN12$ (5[pF]), which is needed to determine whether the detection target exists, as the variation amount $\Delta CN$ (1 [LSB]). Thus, the resolution Res [pF/LSB] is represented by the following equation.

Resolution $Res=\Delta C12/\Delta CN=5/1=5$ [pF/LSB]

In this manner, as the capacitance C12 including the parasitic capacitance of the second capacitor 92 changes from 5 [pF] to 20 [pF], the resolution Res increases tenfold from 0.5 [pF/LSB] to 5 [pF/LSB].

Thus, when the resolution Res changes, the variation amount $\Delta CN$ of the capacitance count value CN is not constant relative to the equivalent variation amount $\Delta CN12$. In this case, a detection distance of the detection target, which is needed to determine whether the detection target exists, changes and therefore the determination accuracy decreases. That is, the change in the parasitic capacitance included in the capacitance of the second capacitor lowers the accuracy of determining whether the detection target exists.

PRIOR ART DOCUMENTS

Patent Documents

Patent Document 1: Japanese Laid-Open Patent Publication No. 2018-44917

SUMMARY OF THE INVENTION

Problems that the Invention is to Solve

It is an objective of the present invention to provide a capacitance sensor capable of preventing the accuracy of determining whether a detection target exists from decreasing due to a change in a parasitic capacitance.

Means for Solving the Problem

A first aspect of the present invention that solves the above-described problem provides a capacitance sensor that includes: a first capacitor and a second capacitor connected in series to a power supply; a first switch connected between two terminals of the first capacitor; a second switch connected between the first capacitor and the second capacitor; a third switch connected between two terminals of the second capacitor; a switch control unit configured to perform a first switching process that turns on the first switch and then repeatedly perform a second switching process that complementarily switches off and on the second switch and the third switch while turning off the first switch; an obtaining unit configured to calculate, as a sensor output value, a number of times the second switching process is repeated until a magnitude relationship reverses between an intermediate potential between the first and second capacitors and a reference potential that has been set in advance; a calculation unit configured to calculate a sensor output corrected value, the sensor output corrected value being obtained by correcting the sensor output value such that a resolution becomes uniform; and a determination unit configured to determine whether a detection target exists from a magnitude relationship between a sensor output difference value and a determination threshold value that has been set in advance, the sensor output difference value being a difference between a current one of the sensor output corrected value and a reference sensor output value that is based on a previous one of the sensor output corrected value. The resolution refers to a change in the capacitance of the second capacitor per unit amount of the sensor output value.

BRIEF DESCRIPTION OF THE DRAWINGS

FIG. 14 is a graph showing the relationship between the resolution and the correction coefficient according to a second embodiment of the present invention.

FIG. 15 is a graph showing the relationship between the corrected threshold value and the sensor output value (variation amount) corresponding to the resolution as the equivalent capacitance of the second capacitor varies.

FIG. 16 is a table illustrating that the corrected threshold value varies in correspondence with the sensor output value (variation amount) corresponding to the resolution as the equivalent capacitance of the second capacitor varies.

MODES FOR CARRYING OUT THE INVENTION

First Embodiment

A capacitance sensor according to a first embodiment of the present invention will now be described with reference to FIGS. 1 to 13.

Figure 1:
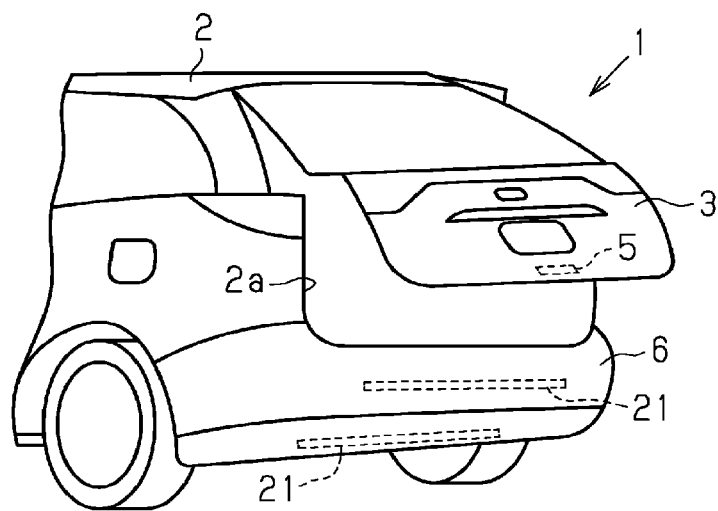
FIG. 1 is perspective view showing the rear part of a vehicle to which a capacitance sensor according to a first embodiment of the present invention is applied.

As shown in FIG. 1, a vehicle 1 such as an automobile includes a body 2, and the rear part of the body 2 includes an opening 2a. The upper part of the opening 2a includes a door hinge (not shown). A back door 3 is coupled to the rear part of the body 2 by the door hinge such that the back door 3 can be opened and closed. The back door 3 opens when lifted upward with respect to the door hinge. The inner side of the back door 3 is provided with a door lock 5. The door lock 5 locks and unlocks the closed back door 3.

Figure 2:
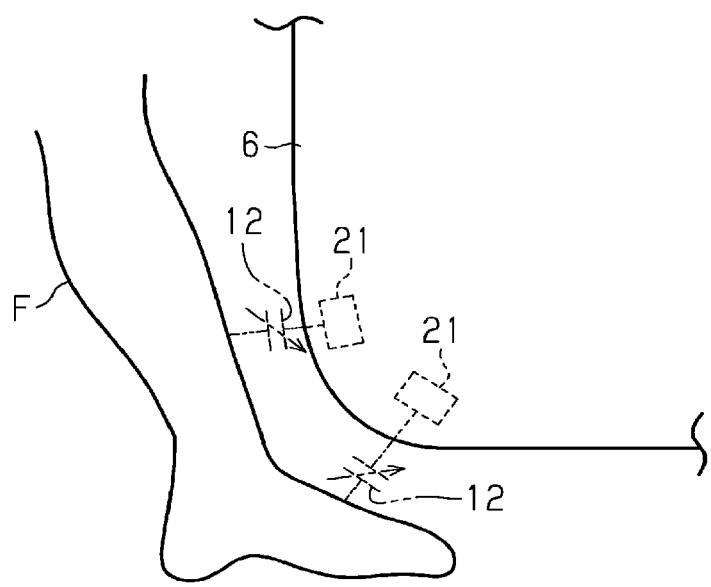
FIG. 2 is a schematic diagram showing the relationship between the electrodes of the capacitance sensor and the detection target.

The rear part of the body 2 includes a bumper 6. The bumper 6 extends in the width direction on the lower side of the opening 2a. The bumper 6 is provided with two electrodes 21, which extend straight in the width direction. As shown in FIG. 2, the electrodes 21 form a second capacitor 12. The capacitance of the second capacitor 12 varies as a foot F of the user approaches the electrode 21. The two second capacitors 12 are used to determine whether an operation of taking the foot F in and out of the section between the lower part of the bumper 6 and the road surface (hereinafter referred to as kick operation) has been performed. Whether the kick operation has been performed corresponds to whether a detection target exists.

The electrical configuration of a capacitance sensor 10 will now be described.

Figure 3:
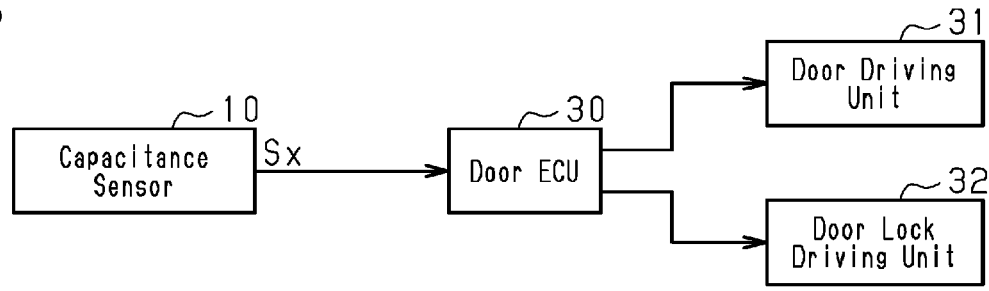
FIG. 3 is a block diagram showing the electrical configuration of the capacitance sensor.

As shown in FIG. 3, the capacitance sensor 10, which includes the two electrodes 21, is electrically connected to a door ECU 30. The door ECU 30 includes, for example, a microcomputer (MCU). The door ECU 30 is electrically connected to a door driving unit 31 and a door lock driving unit 32. The door driving unit 31 includes an electrical drive source, such as an electric motor. The door driving unit 31 opens and closes the back door 3 when mechanically coupled to the back door 3 by a door driving mechanism. The door lock driving unit 32 includes an electrical drive source, such as an electric motor. The door lock driving unit 32 locks and unlocks the door lock 5 when mechanically coupled to the door lock 5 by a lock driving mechanism.

The capacitance sensor 10 outputs a detection signal Sx to the door ECU 30. The detection signal Sx indicates the result of determining whether the kick operation has been performed. The door ECU 30 uses the detection signal Sx from the capacitance sensor 10 to individually control the driving of the door driving unit 31 and the door lock driving unit 32.

More specifically, when the detection signal Sx indicates that the kick operation has been performed, the door ECU 30 detects the opening operation input for the closed back door 3 and detects the unlocking operation input for the locked door lock 5. The door ECU 30 controls the driving of the door driving unit 31 so as to open the back door 3 and controls the driving of the door lock driving unit 32 so as to unlock the door lock 5.

Alternatively, when the detection signal Sx indicates that the kick operation has been performed, the door ECU 30 detects the closing operation input for the open back door 3 and detects the locking operation input for the unlocked door lock 5. The door ECU 30 controls the driving of the door driving unit 31 so as to close the back door 3 and controls the driving of the door lock driving unit 32 so as to lock the door lock 5.

The electrical configuration of the capacitance sensor 10 will now be described. Since the two second capacitors 12 (electrodes 21) have the same electrical configuration, one of the second capacitors 12 will be described.

Figure 4:
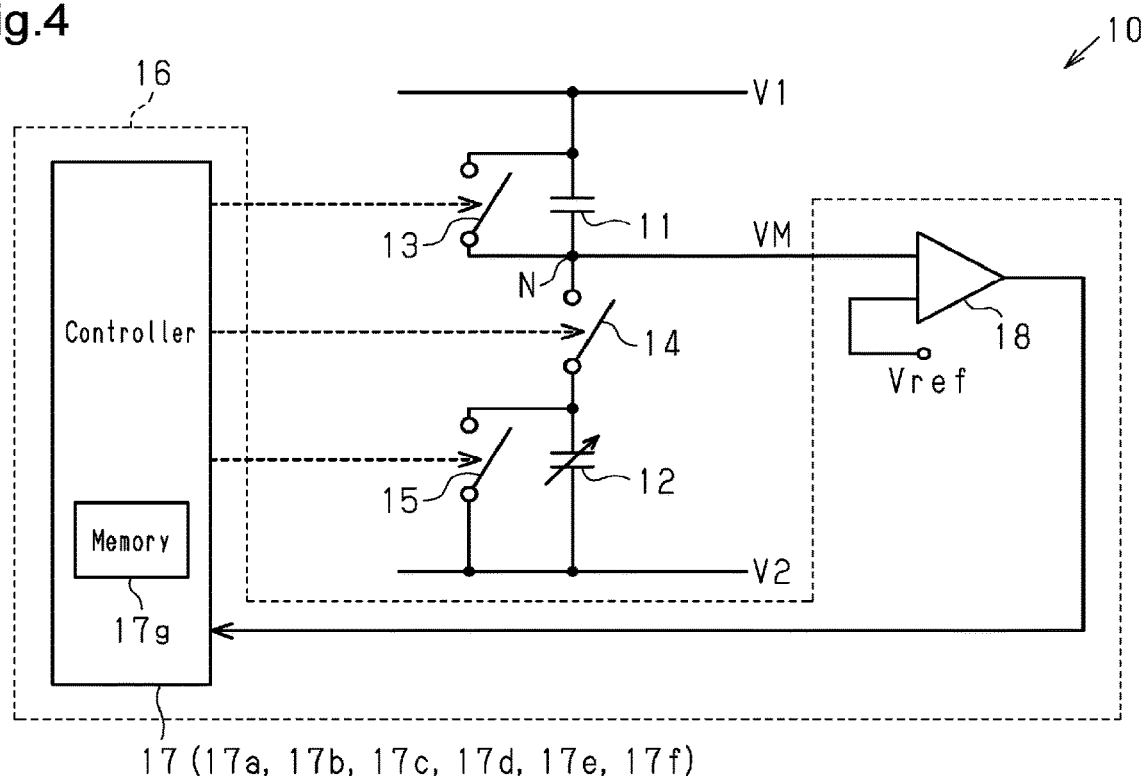
FIG. 4 is a circuit diagram showing the electrical configuration of the capacitance sensor.

As shown in FIG. 4, the capacitance sensor 10 includes a first capacitor 11, the second capacitor 12, a first switch 13, a second switch 14, a third switch 15, and a control circuit 16.

The first capacitor 11 has a predetermined capacitance C11. The first capacitor 11 is configured and arranged such that the capacitance C11 remains unchanged even if the surrounding environment of the vehicle 1 changes or the foot F of the user approaches the electrode 21.

The second capacitor 12 has a generally stable capacitance C12, which is determined by the surrounding environment of the vehicle 1 unless the foot F of the user approaches the electrode 21. The capacitance C12 of the second capacitor 12 changes together with the stray capacitance included in the capacitance C12 when the surrounding environment of the vehicle 1 changes, for example, when foreign matter adheres to the bumper 6 or the electrode 21. In addition, the capacitance C12 of the second capacitor 12 varies as the foot F of the user approaches the electrode 21.

The first capacitor 11 is connected in series to the second capacitor 12 and connected to a power supply. The first capacitor 11 includes a first end and a second end. The first end of the first capacitor 11 is electrically connected to the line of a high potential V1, which serves as the power supply. The second end of the first capacitor 11 is electrically connected to a first end of the second capacitor 12 via the second switch 14. The second capacitor 12 includes a second end that is electrically connected to the line of a low potential V2 (<V1), which serves as the power supply. The low potential V2 is set to be equal to, for example, the potential at the ground.

The first switch 13 initializes the first capacitor 11. More specifically, the first switch 13 is connected between the two terminals of the first capacitor 11 and connected in parallel to the first capacitor 11. When switched on and off, the first switch 13 connects the section between the two terminals of the first capacitor 11 to create a short circuit and breaks the section between the two terminals of the first capacitor 11. The second switch 14 is electrically connected between the first capacitor 11 and the second capacitor 12. When switched on and off, the second switch 14 connects and breaks the first capacitor 11 and the second capacitor 12. The third switch 15 initializes the second capacitor 12. More specifically, the third switch 15 is connected between the two terminals of the second capacitor 12 and connected in parallel to the second capacitor 12. When switched on and off, the third switch 15 connects the section between the two terminals of the second capacitor 12 to create a short circuit and breaks the section between the two terminals of the second capacitor 12.

The control circuit 16 includes a controller 17, which includes a microcomputer (MCU), and a comparison unit 18, which includes a comparator. The comparison unit 18 compares an intermediate potential VM, which is the potential at a connection point N of the first capacitor 11 and the second switch 14, with a reference potential Vref and outputs, to the controller 17, a signal indicating the result of the comparison. The reference potential Vref is set to a potential that is intermediate between the high potential V1 and the low potential V2 (V2<Vref<V1).

The controller 17 executes on-off control (switching control) for the first switch 13, the second switch 14, and the third switch 15. Further, the controller 17 obtains a sensor output value Craw from the output signal of the comparison unit 18, that is, from the result of comparing the intermediate potential VM with the reference potential Vref.

Figure 5:
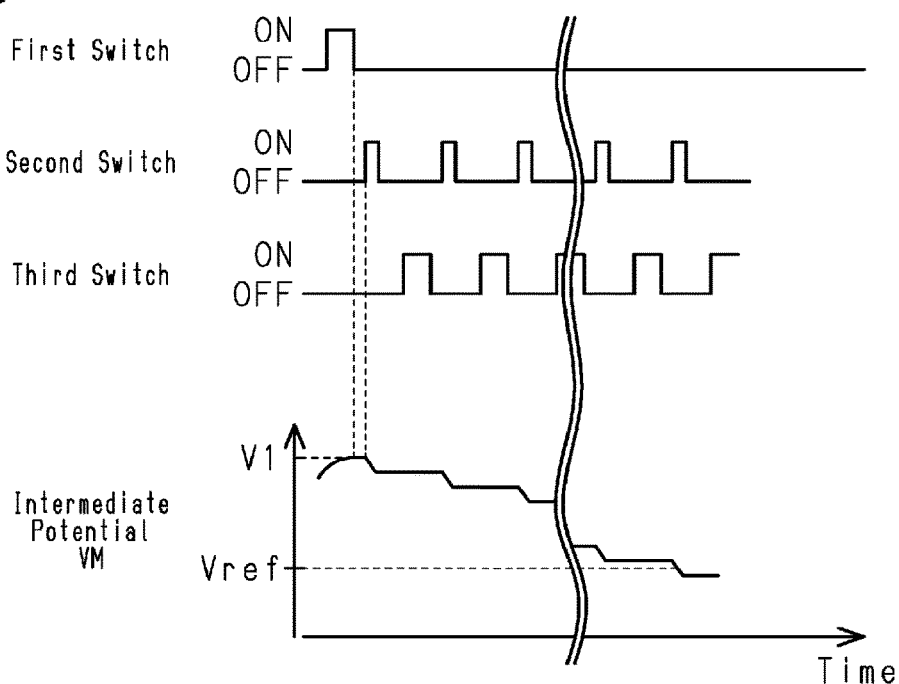
FIG. 5 is a timing diagram showing the changes in the intermediate potential that are caused by switching processes.

The switching control and the process that obtains the sensor output value Craw, which are executed by the controller 17, will now be described with reference to FIG. 5.

The controller 17 serving as a switch control unit 17a activates the first switch 13, the second switch 14, and the third switch 15 in a predetermined cycle. More specifically, the controller 17 executes a first switching process that turns off the second switch 14 and the third switch 15 and turns on the first switch 13 at the beginning of the cycle. This initializes the first capacitor 11 so that the intermediate potential VM becomes equal to the high potential V1.

Subsequently, the controller 17 turns off the third switch 15 and then turns on the second switch 14 with the first switch 13 switched off (this switch operation is hereinafter referred to as a second switch operation). This causes current to flow into the first capacitor 11 and the second capacitor 12, thereby lowering the intermediate potential VM.

Next, the controller 17 turns off the second switch 14 and then turns on the third switch 15 with the first switch 13 off (this switch operation is hereinafter referred to as a third switch operation). This initializes the second capacitor 12.

Then, the controller 17 alternately executes the second switch operation and the third switch operation with the first switch 13 off. That is, the controller 17 repeats a second switching process that complementarily switches off and on the second switch 14 and the third switch 15 while turning off the first switch 13. This gradually lowers the intermediate potential VM.

With the first switch 13 off, the controller 17 repeats the second switching process until the number of times the second switching process has been performed reaches a predetermined number of times Nth. The predetermined number of times Nth is set to be larger than the number of times the second switching process has been repeated until the magnitude relationship between the intermediate potential VM and the reference potential Vref reverses when the capacitance C12 of the second capacitor 12 is the minimum value. This setting is performed so that the magnitude relationship between the intermediate potential VM and the reference potential Vref always reverses until the number of times the second switching process has been performed reaches the predetermined number of times Nth regardless of the capacitance C12 of the second capacitor 12.

With the first switch 13 off, when the number of times the second switching process has been performed reaches the predetermined number of times Nth, the controller 17 resumes the first switching process to repeat the same process as the above-described one.

The controller 17 serving as an obtaining unit 17b counts the number of times the second switching process has been repeated until the magnitude relationship between the intermediate potential VM and the reference potential Vref reverses. That is, the controller 17 uses the output signal of the comparison unit 18 to count the number of times the second switching process has been repeated until the intermediate potential VM is determined as being lower than the reference potential Vref (VN<Vref). Then, the controller 17 obtains, as the sensor output value Craw [LSB], the number of the repetitions when the intermediate potential VM is determined as being lower than the reference potential Vref. The sensor output value Craw [LSB] correlates with the discharge capacitance of the second capacitor 12 per operation of the second switching process, that is, correlates with the capacitance C12 [pF] of the second capacitor 12. That is, the sensor output value Craw [LSB] serves as an index of the capacitance C12 [pF].

Figure 6:
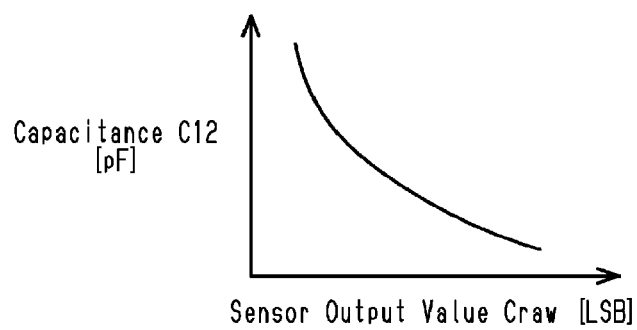
FIG. 6 is a graph showing the relationship between the sensor output value and the capacitance of the second capacitor.

More specifically, the capacitance C12 [pF] is a known exponential function of the sensor output value Craw [LSB]. As shown in FIG. 6, the exponential function indicates a feature in which the capacitance C12 [pF] increases as the sensor output value Craw [LSB] decreases. This is because the discharge capacitance per operation of the second switching process increases as the capacitance C12 [pF] increases and therefore the number of times the second switching process has been repeated (i.e., the sensor output value Craw [LSB]) decreases.

The controller 17 serving as a calculation unit 17c calculates a sensor output corrected value CrawR, which is obtained by correcting the sensor output value Craw [LSB] such that the resolution Res [pF/LSB] becomes uniform. That is, the controller 17 calculates the capacitance C12 [pF] by substituting the sensor output value Craw [LSB] into the above-described exponential function (refer to FIG. 6).

Figure 7:
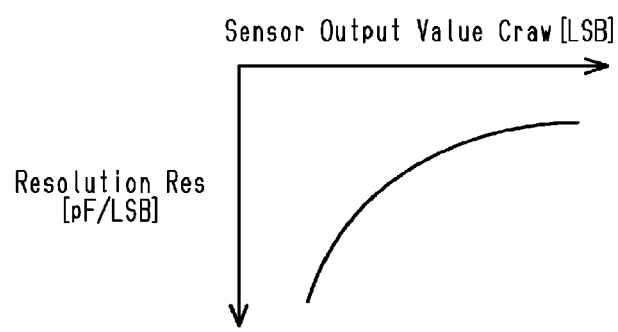
FIG. 7 is a graph showing the relationship between the sensor output value and the resolution.

In addition, the controller 17 calculates the resolution Res [pF/LSB] by differentiating the capacitance C12 [pF]. More specifically, the controller 17 calculates the resolution Res [pF/LSB] from the difference between the capacitance C12 [pF] and the value [pF] obtained by substituting, into the exponential function, a value obtained by subtracting 1 [LSB] from the sensor output value Craw [LSB]. As shown in FIG. 7, the resolution Res [pF/LSB] changes in correspondence with the sensor output value Craw [LSB].

Figure 8:
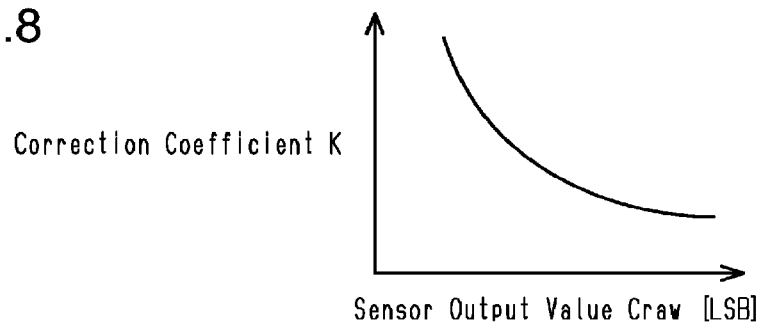
FIG. 8 is a graph showing the relationship between the sensor output value and the correction coefficient.

Further, the controller 17 calculates the magnitude (absolute value) of the resolution Res [pF/LSB] as a correction coefficient K. The correction coefficient K may be obtained by multiplying the resolution Res [pF/LSB] by a predetermined number. As shown in FIG. 8, the correction coefficient K changes in correspondence with the resolution Res [pF/LSB].

The controller 17 calculates the sensor output corrected value CrawR by multiplying the correction coefficient K by the sensor output value Craw [LSB].

In this manner, the controller 17 calculates the sensor output corrected value CrawR, which is obtained by correcting the sensor output value Craw [LSB] using the resolution Res [pF/LSB]. This is because when the sensor output value Craw [LSB] changes to a larger extent than when the sensor output value Craw [LSB] varies depending on whether the kick operation has been performed, the resolution Res [pF/LSB] changes so that the variation amount of the sensor output value Craw [LSB] is inconstant relative to the variation amount of the equivalent capacitance C12 [pF].

Figure 9:
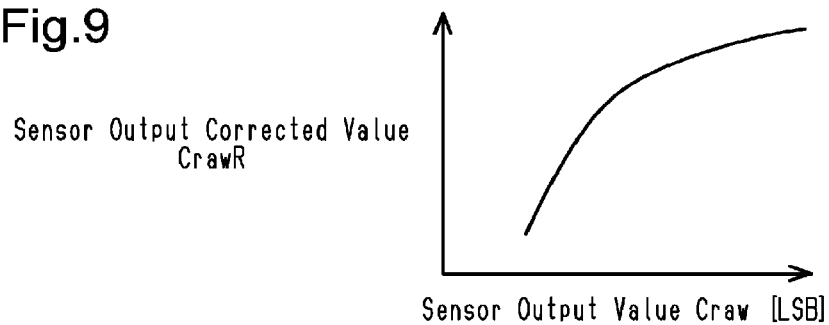
FIG. 9 is a graph showing the relationship between the sensor output value and the sensor output corrected value.

FIG. 9 is a graph showing the relationship between the sensor output value Craw [LSB] and the calculated sensor output corrected value CrawR. In this case, the variation amount of the calculated sensor output corrected value CrawR is constant with respect to the variation amount of the equivalent capacitance C12 [pF]. Thus, the distance of detecting the foot F, which is needed to determine whether the kick operation has been performed, remains unchanged. This prevents the determination accuracy from decreasing.

The overview of the sensor output corrected value CrawR, in which the resolution Res [pF/LSB] is uniform, will now be briefly described. For sake of understanding the specification, the resolution Res [pF/LSB] is set to be a positive number in correspondence with the correction coefficient K. The sensor output value Craw [LSB] and the sensor output corrected value CrawR represent the magnitude (absolute value) of the variation amount obtained by the kick operation.

Figures 10, 11:
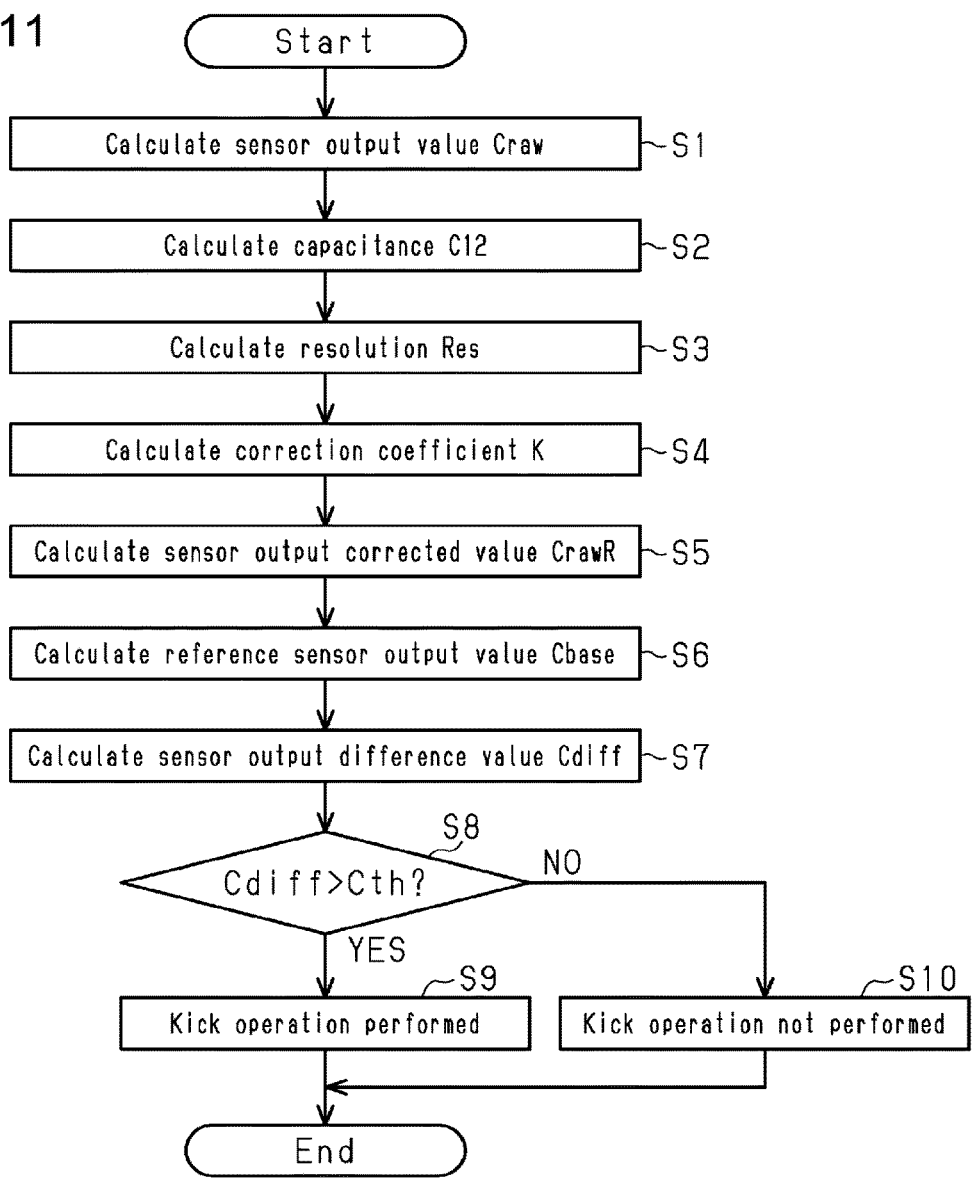
FIG. 10 is a table illustrating that the variation amount of the sensor output corrected value, which is obtained by correcting the sensor output value with the correction coefficient corresponding to the resolution, is constant relative to the variation amount of the equivalent capacitance.
FIG. 11 is a flowchart illustrating a process that determines whether the detection target exists using the capacitance sensor.

As shown in FIG. 10, it is assumed that the variation amount of the capacitance C12 [pF] is 10 [pF] and the sensor output value Craw [LSB] relative to the variation amount of the capacitance C12 is different because of the difference of the resolution Res [pF/LSB].

That is, it is assumed that when the resolution Res is 0.5 [pF/LSB], the sensor output value Craw is 20 [LSB]. In this case, when the correction coefficient K is set to 0.5 and the sensor output corrected value CrawR is multiplied by the correction coefficient K, the sensor output corrected value CrawR becomes 10 (10=20×0.5).

Further, it is assumed that when the resolution Res is 1 [pF/LSB], the sensor output value Craw is 10 [LSB]. In this case, when the correction coefficient K is set to 1 and the sensor output corrected value CrawR is multiplied by the correction coefficient K, the sensor output corrected value CrawR becomes 10 (10=10×1).

Furthermore, it is assumed that when the resolution Res is 5 [pF/LSB], the sensor output value Craw is 2 [LSB]. In this case, when the correction coefficient K is set to 5 and the sensor output corrected value CrawR is multiplied by the correction coefficient K, the sensor output corrected value CrawR becomes 10 (10=2×5).

Accordingly, it is observed that the variation amount of the sensor output corrected value CrawR relative to the variation amount of the equivalent capacitance C12 [pF] is constant when the resolution Res [pF/LSB] is uniform.

The manner of determining whether the kick operation has been performed in the first embodiment will now be described. This process is repeatedly executed by an interruption in a predetermined time, such as a cycle of repeating the first switching process.

As shown in FIG. 11, the controller 17 first calculates (obtains) the sensor output value Craw in the above-described manner (step S1). Next, the controller 17 uses the sensor output value Craw to calculate the capacitance C12 (step S2). Then, the controller 17 uses the capacitance C12 to calculate the resolution Res (step S3). Subsequently, the controller 17 uses the resolution Res to calculate the correction coefficient K (step S4). Then, the controller 17 multiplies the correction coefficient K by the sensor output value Craw to calculate the sensor output corrected value CrawR (step S5).

Next, the controller 17 uses the previous sensor output corrected value CrawR to calculate a reference sensor output value Cbase (step S6). More specifically, the controller 17 calculates, as the reference sensor output value Cbase, the average value of the sensor output corrected values CrawR in a predetermined time that is sufficiently longer than a calculation cycle (step S6).

The reference sensor output value Cbase is, for example, a stabilized value serving as the reference for comparison with the sensor output corrected value CrawR, which varies when the kick operation is performed. In other words, the previous sensor output corrected value CrawR is reflected on the reference sensor output value Cbase such that the reference sensor output value Cbase is not varied by the kick operation. The resolution Res of the reference sensor output value Cbase calculated from the sensor output corrected value CrawR is uniform. In this case, the reference sensor output value Cbase may be calculated including the current sensor output corrected value CrawR. Alternatively, the sensor output corrected value CrawR before the predetermined time may be used as the reference sensor output value Cbase.

Then, the controller 17 calculates a sensor output difference value Cdiff (step S7). The sensor output difference value Cdiff is the magnitude (absolute value) of the difference between the current sensor output corrected value CrawR and the reference sensor output value Cbase. The sensor output difference value Cdiff is an index of the variation amount of the capacitance C12, and is obtained by correcting the variation amount of the sensor output value Craw such that the resolution Res becomes uniform.

Subsequently, the controller 17 serving as a determination unit 17d determines whether the sensor output difference value Cdiff is greater than a predetermined determination threshold value Cth, which has been set in advance (step S8). The determination threshold value Cth is suitable for representing the amount of the sensor output corrected value CrawR varied by the kick operation. When the sensor output difference value Cdiff is greater than the determination threshold value Cth, the controller 17 determines that the kick operation has been performed because the variation amount of the sensor output corrected value CrawR is large (step S9). Then, the controller 17 ends this process. When the sensor output difference value Cdiff is less than or equal to the determination threshold value Cth, the controller 17 determines that the kick operation has not been performed because the variation amount of the sensor output corrected value CrawR is small (step S10). Then, the controller 17 ends this process.

The above-described process avoids situations in which the accuracy of determining whether the kick operation has been performed is lowered due to a change in the resolution Res (i.e., by a change in the parasitic capacitance included in the capacitance C12).

Figure 12:
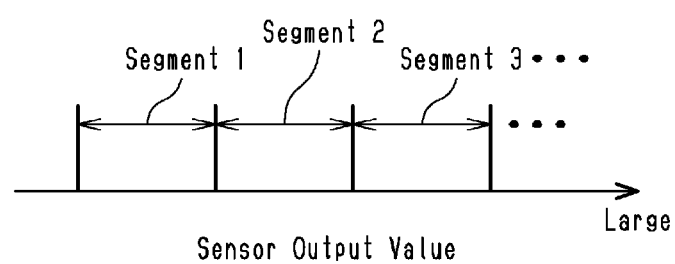
FIG. 12 is a schematic diagram showing the relationship between the sensor output value and the segments into which the entire range of the sensor output value is divided.

As shown in FIG. 12, the entire range of the sensor output value Craw is divided into continuous segments n (n=1, 2, . . . ) in advance without overlapping each other. The controller 17 serving as a segment determination unit 17e determines which one of the segments 11 the current sensor output value Craw belongs to. The controller 17 serving as a segment counting unit 17f counts, for each of the segments n, the number of times (frequency) CNTn (n=1, 2, . . . ) the sensor output value Craw has been determined as belonging to the segment n. At the same time, the controller 17 stores, in a memory 17g including a non-volatile memory, the result of counting the number of times CNTn for each of the segments n. The storing is performed in order to obtain a feature, such as a distribution status of the parasitic capacitance (capacitance C12) of the second capacitor 12, by reading the counting result (number of times CNTn) from the memory 17g during maintenance or the like.

The manner of counting the number of times CNTn for each of the segments n will now be described. This process is activated when, for example, the determination result of the segment n to which the sensor output value Craw belongs is switched from the previous time.

Figure 13:
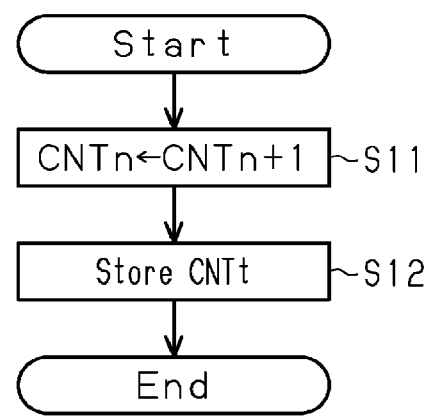
FIG. 13 is a flowchart illustrating a process that counts the number of times for each of the segments using the capacitance sensor.

As shown in FIG. 13, the controller 17 updates the number of times CNTn of the current segment n in which the determination result has been switched, by incrementing the number of times CNTn by 1 (step S11). Subsequently, the controller 17 stores the updated number of times CNTn in the memory 17g (step S12). Then, the controller 17 ends this process.

The above-described process provides the feature such as the distribution status of the parasitic capacitance (capacitance C12) of the second capacitor 12.

The operation and advantages of the first embodiment will now be described.

(1) The current sensor output corrected value CrawR and the reference sensor output value Cbase are corrected such that the resolution Res becomes uniform. As a result, even if the parasitic capacitance included in the capacitance C12 of the second capacitor 12 is different, the sensor output difference value Cdiff is calculated to the same value at the same level as long as the variation amount of the capacitance C12 is the same. Thus, the controller 17 (determination unit 17d) is capable of determining at the same level whether the kick operation has been performed from the magnitude relationship between the sensor output difference value Cdiff and the determination threshold value Cth. This avoids situations in which the accuracy of determining whether the kick operation has been performed is lowered due to a change in the parasitic capacitance included in the capacitance C12 of the second capacitor 12.

(2) For each of the segments n, the number of times CNTn the sensor output value Craw, which correlates with the capacitance C12 (parasitic capacitance) of the second capacitor 12, has been determined as belonging to the segment n is counted. Further, the counting result for each segment n is stored in the memory 17g. Thus, a feature such as the distribution status of the parasitic capacitance (capacitance C12) of the second capacitor 12 is obtained by reading the counting result from the memory 17g during maintenance or the like. Additionally, the distribution status of the capacitance C12 (parasitic capacitance) of the second capacitor 12 is used to assume the use environment of the capacitance sensor 10 collected through the maintenance or the like and analyze the reason of a fault.

(3) Even if the parasitic capacitance included in the capacitance C12 of the second capacitor 12 is different, it is determined on the same level whether the kick operation has been performed. This limits a decrease in the accuracy of detecting the operation input for the back door 3 and the door lock 5 (operation targets). That is, even if foreign matter adheres to the bumper 6 or the electrode 21 to change the parasitic capacitance included in the capacitance C12 of the second capacitor 12, a decrease is limited in the accuracy of detecting the operation input for the back door 3 and the door lock 5. This reduces erroneous detection of the operation input the back door 3 and the door lock 5.

(4) When the result of determining the segment n by the segment determination unit 17e is switched, the segment counting unit 17f updates the number of times CNTn of the current segment n in which the determination result has been switched. This prevents the segment counting unit 17f from unnecessarily continuing to update the number of times CNTn of the segment n when the result of determining the segment n by the segment determination unit 17e remains unchanged over a long period of time. The segment counting unit 17f only needs to monitor the switching of the result of determining the segment n by the segment determination unit 17e. This reduces the calculating load (processing load) on the segment counting unit 17f. The reduction in the calculating load on the segment counting unit 17f (controller 17) shortens the processing time of the controller 17 and consequently shortens the sampling cycle.

Second Embodiment

A capacitance sensor according to a second embodiment of the present invention will now be described with reference to FIGS. 6, 7, and 14 to 17. The configuration of the second embodiment that is the same as the configuration of the first embodiment will not be described in detail.

Referring to FIGS. 14 to 17, the controller 17 serving as the calculation unit 17c calculates a corrected threshold value CthR [LSB], which is obtained by correcting the determination threshold value Cth [LSB] so as to be proportional to the reciprocal of the resolution Res [pF/LSB] of the sensor output value Craw [LSB]. The determination threshold value Cth [LSB] is suitable for indicating the amount of the sensor output value Craw varied by the kick operation when unaffected by the resolution Res [pF/LSB]. The corrected threshold value CthR [LSB] is obtained by correcting the determination threshold value Cth [LSB] in correspondence with the amount of the sensor output value Craw, which is varied by the kick operation and is changed in correspondence with the resolution Res [pF/LSB].

That is, the controller 17 calculates the capacitance C12 [pF] by substituting the sensor output value Craw [LSB] into the above-described exponential function (refer to FIG. 6). In addition, the controller 17 calculates the resolution Res [pF/LSB] by differentiating the capacitance C12 [pF]. More specifically, the controller 17 calculates the resolution Res [pF/LSB] from the difference between the capacitance C12 [pF] and the value [pF] obtained by substituting, into the exponential function, a value obtained by subtracting 1 [LSB] from the sensor output value Craw [LSB]. As shown in FIG. 7, the resolution Res [pF/LSB] changes in correspondence with the sensor output value Craw [LSB].

Further, the controller 17 calculates the magnitude (absolute value) of the reciprocal of the resolution Res [pF/LSB] as the correction coefficient K. As shown in FIG. 14, the correction coefficient K is inversely proportional to the resolution Res [pF/LSB].

The controller 17 calculates the corrected threshold value CthR [LSB] by multiplying the correction coefficient K by the determination threshold value Cth [LSB].

In this manner, the controller 17 calculates the corrected threshold value CthR [LSB], which is obtained by correcting the determination threshold value Cth [LSB] so as to be proportional to the reciprocal of the resolution Res [pF/LSB] of the sensor output value Craw [LSB]. This is because when the sensor output value Craw [LSB] changes to a larger extent than when the sensor output value Craw [LSB] varies depending on whether the kick operation has been performed, the resolution Res [pF/LSB] changes so that the variation amount of the sensor output value Craw [LSB] is inconstant relative to the variation amount of the equivalent capacitance C12 [pF]. That is, the variation amount of the sensor output value Craw [LSB] relative to the variation amount of the equivalent capacitance C12 [pF] is proportional to the reciprocal of the resolution Res [pF/LSB]. Thus, in correspondence with this proportionality, the determination threshold value Cth [LSB], which is needed to determine whether the kick operation has been performed, is corrected to the corrected threshold value CthR [LSB].

FIG. 15 is a graph showing the relationship between the calculated determination threshold value Cth [LSB] and the variation amount of the sensor output value Craw [LSB] that is obtained when the amount of the capacitance C12 [pF] varied by the kick operation is regarded as being equivalent. In this case, the calculated determination threshold value Cth [LSB] is proportional to the variation amount of the sensor output value Craw [LSB] changed in correspondence with the resolution Res [pF/LSB]. Thus, the distance of detecting the foot F, which is needed to determine whether the kick operation has been performed, remains unchanged. This prevents the determination accuracy from decreasing.

The relationship between the corrected threshold value CthR [LSB] and the variation amount of the sensor output value Craw [LSB], which changes in correspondence with the resolution Res [pF/LSB], relative to the amount of the capacitance C12 [pF] varied by the kick operation will now be briefly described. For the sake of simplifying the specification, the resolution Res [pF/LSB] is set to be a positive number in correspondence with the correction coefficient K. The sensor output value Craw [LSB] indicates the magnitude (absolute value) of the variation amount.

As shown in FIG. 16, it is assumed that the amount of the capacitance C12 [pF] varied by the kick operation is 10 [pF] and the sensor output value Craw [LSB] relative to the variation amount of the capacitance C12 is different because of the difference of the resolution Res [pF/LSB]. The determination threshold value Cth [LSB] prior to correction is set to 10 [LSB].

It is assumed that when the resolution Res is 0.5 [pF/LSB], the sensor output value Craw is 20 [LSB]. In this case, when the correction coefficient K is set to the reciprocal of 0.5 (i.e., 2) and this value is multiplied by the determination threshold value Cth [LSB], the determination threshold value Cth subsequent to correction (that is, corrected threshold value CthR) becomes 20 (20=10×2) [LSB].

Further, it is assumed that when the resolution Res is 1 [pF/LSB], the sensor output value Craw is 10 [LSB]. In this case, when the correction coefficient K is set to the reciprocal of 1 (i.e., 1) and this value is multiplied by the determination threshold value Cth [LSB], the determination threshold value Cth subsequent to correction (that is, corrected threshold value CthR) becomes 10 (10=10×1) [LSB].

Furthermore, it is assumed that when the resolution Res is 5 [pF/LSB], the sensor output value Craw is 2 [LSB]. In this case, when the correction coefficient K is set to the reciprocal of 5 (i.e., 0.2) and this value is multiplied by the determination threshold value Cth [LSB], the determination threshold value Cth subsequent to correction (that is, corrected threshold value CthR) becomes 2 (10=10×0.2) [LSB].

Accordingly, it is observed that the corrected threshold value CthR [LSB] is corrected in correspondence with the variation amount of the sensor output value Craw [LSB], which changes in correspondence with the resolution Res [pF/LSB], relative to the amount of the capacitance C12 [pF] varied by the kick operation.

The manner of determining whether the kick operation has been performed in the second embodiment will now be described.

Figure 17:
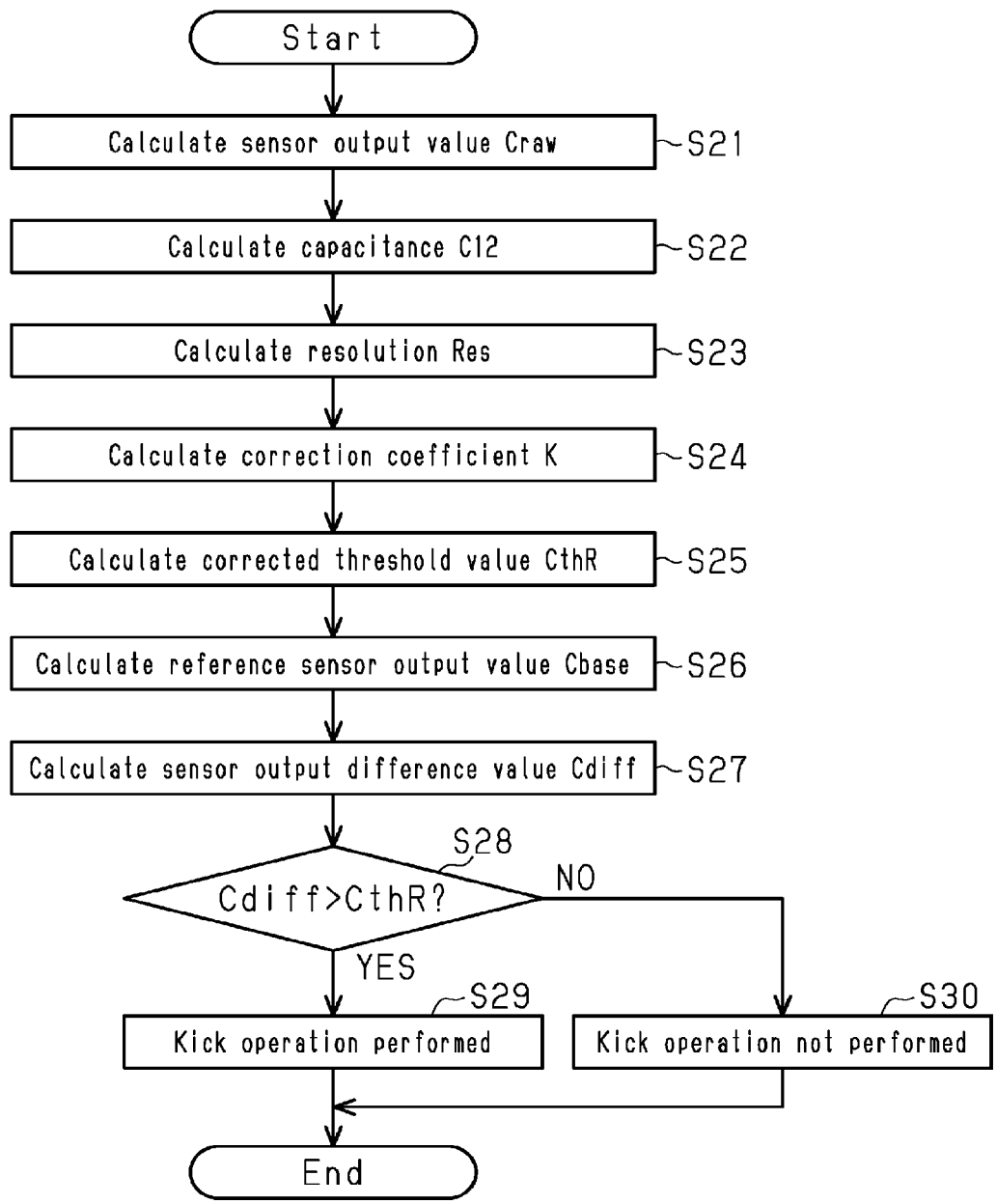
FIG. 17 is a flowchart illustrating a process that determines whether the detection target exists using the capacitance sensor.

As shown in FIG. 17, the controller 17 first calculates (obtains) the sensor output value Craw in the above-described manner (step S21). Next, the controller 17 uses the sensor output value Craw to calculate the capacitance C12 (step S22). Then, the controller 17 uses the capacitance C12 to calculate the resolution Res (step S23). Subsequently, the controller 17 uses the reciprocal of the resolution Res to calculate the correction coefficient K (step S24). Then, the controller 17 multiplies the correction coefficient K by the determination threshold value Cth to calculate the corrected threshold value CthR (step S25).

Next, the controller 17 uses the previous sensor output value Craw to calculate the reference sensor output value Cbase (step S26). More specifically, the controller 17 calculates, as the reference sensor output value Cbase, the average value of the sensor output values Craw in a predetermined time that is sufficiently longer than a calculation cycle (step S26).

The reference sensor output value Cbase is, for example, a stabilized value serving as the reference for comparison with the sensor output value Craw, which varies when the kick operation is performed. In other words, the previous sensor output value Craw is reflected on the reference sensor output value Cbase such that the reference sensor output value Cbase is not varied by the kick operation. The resolution Res of the reference sensor output value Cbase is equivalent to that of the sensor output value Craw. In this case, the reference sensor output value Cbase may be calculated including the current sensor output value Craw. Alternatively, the sensor output value Craw before the predetermined time may be used as the reference sensor output value Cbase.

Then, the controller 17 calculates a sensor output difference value Cdiff (step S27). The sensor output difference value Cdiff is the magnitude (absolute value) of the difference between the current sensor output value Craw and the reference sensor output value Cbase. The sensor output difference value Cdiff is an index of the variation amount of the capacitance C12. The resolution Res of the sensor output difference value Cdiff is equivalent to that of the sensor output value Craw or the like.

Subsequently, the controller 17 serving as the determination unit 17d determines whether the sensor output difference value Cdiff is greater than the corrected threshold value CthR (step S28). When the sensor output difference value Cdiff is greater than the corrected threshold value CthR, the controller 17 determines that the kick operation has been performed because the variation amount of the sensor output value Craw is large (step S29). Then, the controller 17 ends this process. When the sensor output difference value Cdiff is less than or equal to the determination threshold value CthR, the controller 17 determines that the kick operation has not been performed because the variation amount of the sensor output value Craw is small (step S30). Then, the controller 17 ends this process.

The operation and advantages of the second embodiment will now be described.

(1) The sensor output difference value Cdiff basically has a resolution equivalent to the resolution Res of the sensor output value Craw as well as the reference sensor output value Cbase. Accordingly, as long as the variation amount of the capacitance C12 of the second capacitor 12 is equivalent, the sensor output difference value Cdiff changes in proportion to the reciprocal of the resolution Res. The corrected threshold value CthR is obtained by correcting the determination threshold value Cth so as to be proportional to the reciprocal of the resolution Res of the sensor output value Craw. Thus, even if the parasitic capacitance included in the capacitance C12 of the second capacitor 12 is different, the controller 17 (determination unit 17d) is capable of determining at the same level whether the kick operation has been performed from the magnitude relationship between the sensor output difference value Cdiff and the corrected threshold value CthR. This avoids situations in which the accuracy of determining whether the kick operation has been performed is lowered due to a change in the parasitic capacitance included in the capacitance C12 of the second capacitor 12.

The above-described embodiments may be modified as follows. The above-described embodiments and the following modifications can be combined as long as the combined modifications remain technically consistent with each other.

Figure 18:
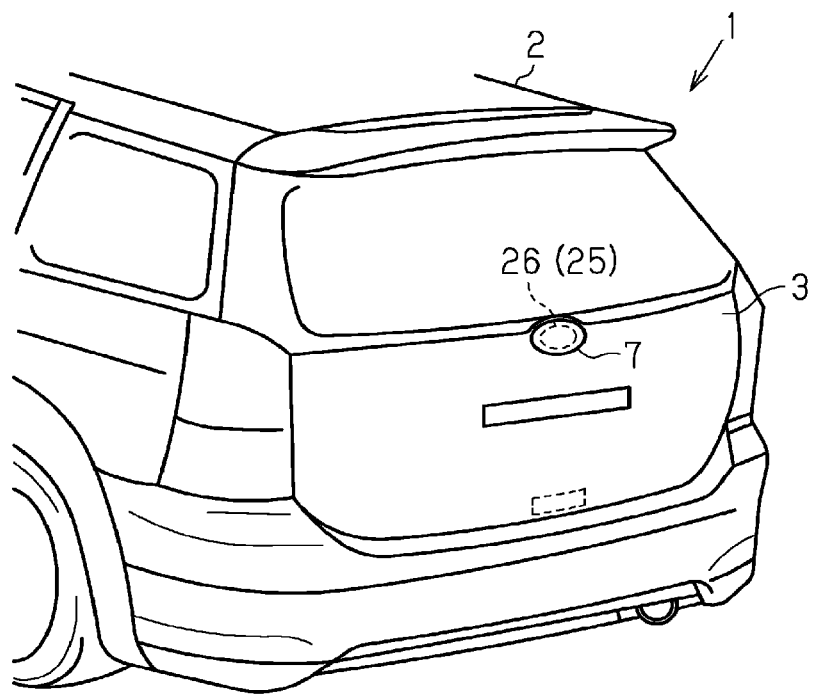
FIG. 18 is a perspective view showing the rear part of a vehicle to which a capacitance sensor according to a modification is applied.

As shown in FIG. 18, the middle portion of the outer surface of the back door 3 includes an emblem 7, which shows a company name or the like. In this case, an electrode 26 on the rear side of the emblem 7 may form a second capacitor 25. The second capacitor 25 is used to determine whether the user's operation of moving the hand or finger toward the emblem 7 has been performed (whether a detection target exists). In this case, even if foreign matter adheres to the emblem 7 or the electrode 26 to change the parasitic capacitance included in the capacitance of the second capacitor 25, a decrease is limited in the accuracy of determining whether the operation has been performed.

Figure 19:
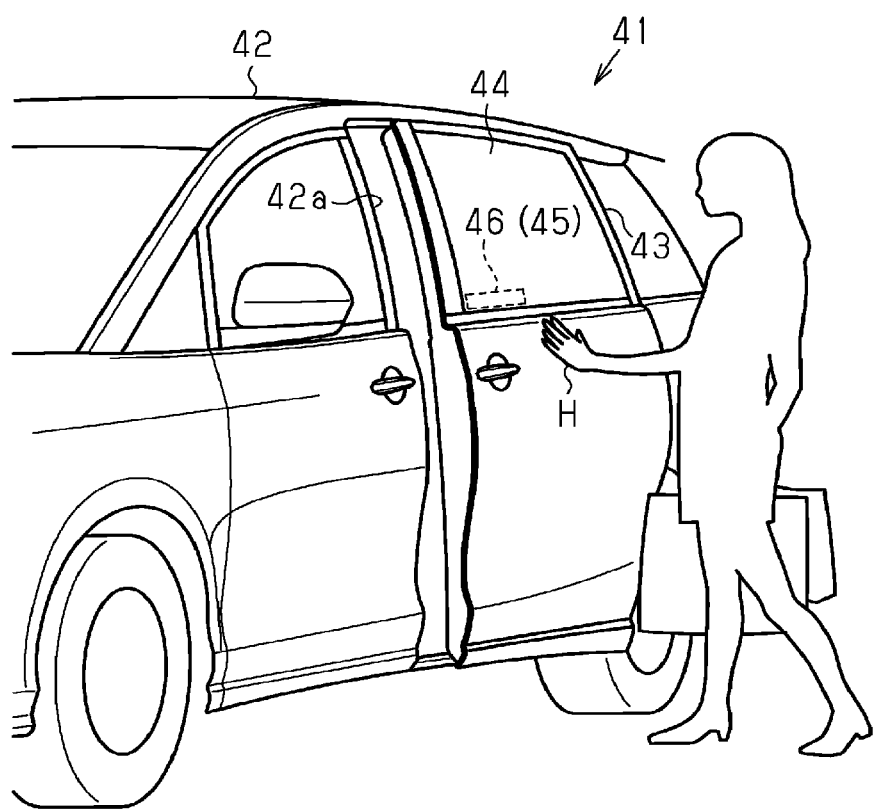
FIG. 19 is a perspective view showing the side part of a vehicle to which a capacitance sensor according to another modification is applied.
Figure 20A:
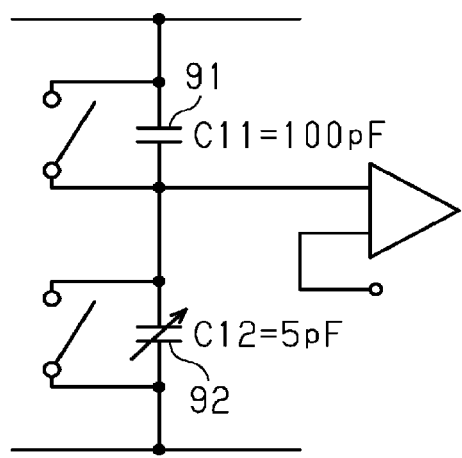
FIGS. 20A and 20B are diagrams illustrating examples of the resolution obtained when the parasitic capacitance of the second capacitor is relatively small.
Figure 20B:
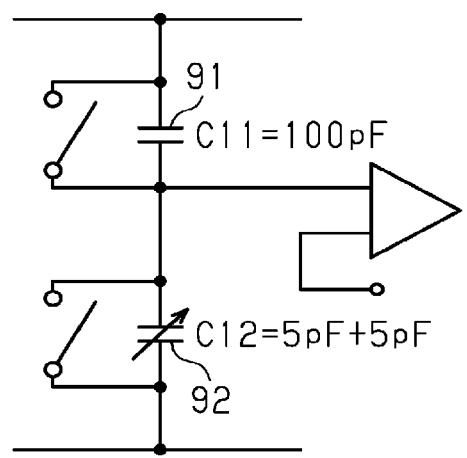
Figure 21A:
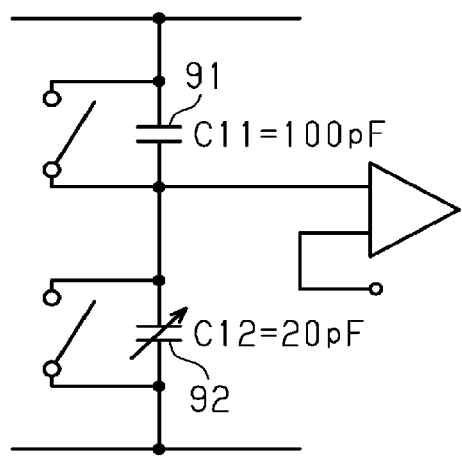
FIGS. 21A and 21B are diagrams illustrating examples of the resolution obtained when the parasitic capacitance of the second capacitor is relatively large.
Figure 21B:
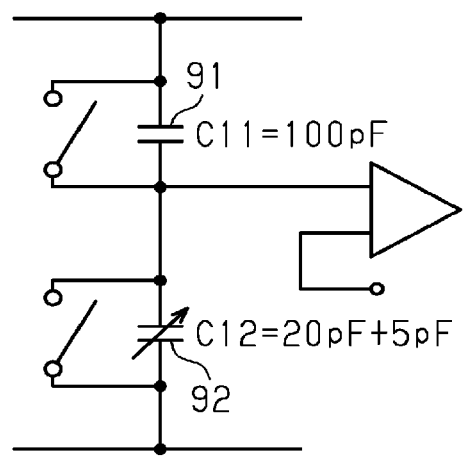

As shown in FIG. 19, the side part of a body 42 of a vehicle 41 includes a sliding door 43. The sliding door 43 opens and closes an opening 42a. In this case, an electrode 46 in a window glass 44 of the sliding door 43 may form a second capacitor 45. The second capacitor 45 is used to determine whether the user's operation of moving a hand H toward the window glass 44 has been performed (whether a detection target exists). In this case, even if foreign matter adheres to the window glass 44 or the electrode 46 to change the parasitic capacitance included in the capacitance of the second capacitor 45, a decrease is limited in the accuracy of determining whether the operation has been performed.

In each of the above-described embodiments, an electrode in a rocker panel of the vehicle 1 may form a second capacitor. The second capacitor is used to determine whether the kick operation has been performed (whether a detection target exists). In this case, even if foreign matter adheres to the rocker panel or the electrode to change the parasitic capacitance included in the capacitance of the second capacitor, a decrease is limited in the accuracy of determining whether the kick operation has been performed.

In each of the above-described embodiments, the controller 17 (calculation unit 17c) may calculate the sensor output corrected value CrawR by integrating the resolution Res by the sensor output value Craw.

In each of the above-described embodiments, the controller 17 may store, in the memory 17g in advance, a map or table showing the relationship between the sensor output value Craw and the capacitance C12. The controller 17 may calculate the capacitance C12 in reference to the map or table read from the memory 17g. This eliminates the need to calculate the capacitance C12 by substituting the sensor output value Craw into the above-described exponential function. As a result, the calculating load (processing load) on the controller 17 is reduced.

In each of the above-described embodiments, the controller 17 may store, in the memory 17g in advance, a map or table showing the relationship between the sensor output value Craw and the resolution Res. The controller 17 may calculate the resolution Res in reference to the map or table read from the memory 17g. This eliminates the need to calculate the resolution Res using a theoretical equation (for example, exponential function). As a result, the calculating load on the controller 17 is reduced.

In each of the above-described embodiments, the controller 17 may store, in the memory 17g in advance, a map or table showing the relationship between the sensor output value Craw and the correction coefficient K. The controller 17 may calculate the correction coefficient K in reference to the map or table read from the memory 17g. This eliminates the need to calculate the correction coefficient K using a theoretical equation (for example, exponential function). As a result, the calculating load on the controller 17 is reduced. The reduction in the calculating load on the controller 17 shortens the processing time of the controller 17, thereby shortening the sampling cycle. Alternatively, the reduction in the calculating load on the controller 17 downgrades the calculating performance of the controller 17, thereby reducing costs.

As another option, a table in which the correction coefficient K gradually changes in correspondence with the sensor output value Craw may be used. For example, the controller 17 may store, for each of the sections n, the correction coefficient K, which is used to correct the sensor output value Craw, in the memory 17g in advance. For the resolution Res of the sensor output value Craw to become uniform, the correction coefficient K is set to a value proportional to the resolution Res. The controller 17 may calculate the sensor output corrected value CrawR from the correction coefficient K corresponding to the section n to which the sensor output value Craw belongs. This culls the data indicating the relationship between the sensor output value Craw and the correction coefficient K, thereby reducing the storage capacity required for the memory 17g (the storage amount used in the memory 17g) requested by the memory 17g. In this case, the correction coefficient K may be corrected through linear interpolation. This allows for accurate calculation of the correction coefficient K from which the data has been culled.

In the first embodiment, the controller 17 may store, in the memory 17g in advance, a map or table showing the relationship between the sensor output value Craw and the sensor output corrected value CrawR. The controller 17 may calculate the sensor output corrected value CrawR in reference to the map or table read from the memory 17g. This eliminates the need to calculate the sensor output corrected value CrawR using a theoretical equation (for example, exponential function). As a result, the calculating load on the controller 17 is reduced. The reduction in the calculating load on the controller 17 shortens the processing time of the controller 17, thereby shortening the sampling cycle. Alternatively, the reduction in the calculating load on the controller 17 downgrades the calculating performance of the controller 17, thereby reducing costs.

As another option, a table in which the sensor output corrected value CrawR gradually changes in correspondence with the sensor output value Craw may be used. This culls the data indicating the relationship between the sensor output value Craw and the sensor output corrected value CrawR, thereby reducing the storage capacity required for the memory 17g (the storage amount used in the memory 17g) requested by the memory 17g. In this case, the sensor output corrected value CrawR may be corrected through linear interpolation. This allows for accurate calculation of the sensor output corrected value CrawR from which the data has been culled.

In the first embodiment, the segments n may be obtained by dividing the entire range of any one of the sensor output corrected value CrawR, which correlates with the sensor output value Craw, the correction coefficient K, the resolution Res, and the capacitance C12. Alternatively, the segments n may be obtained by dividing the entire range of the reference sensor output value Cbase that is based on the previous sensor output value Craw. Further, the controller 17 may count, for each of the segments n, the number of times the sensor output corrected value CrawR, the correction coefficient K, the resolution Res, the capacitance C12, or the reference sensor output value Cbase has been determined as belonging to the segment n and store the result of counting the number of times in the memory 17g.

In each of the above-described embodiments, the processes that, for example, count and store the number of times CNTn for each of the segments n may be omitted.

In each of the above-described embodiments, the operation target for detecting the operation input may be a movable component of the vehicle other than the back door 3 and the sliding door 43 (for example, a swing door, a trunk lid, a sunroof, a window regulator, a fuel lid, a hood, or a seat).

In each of the above-described embodiments, the operation for the opening-closing body of the vehicle such as the back door 3 and the sliding door 43 is not limited to the opening-closing operation or the locking-unlocking operation. Instead, the operation for the opening-closing body may be, for example, a pausing operation or a reserving operation.

In the second embodiment, the controller 17 may store, in the memory 17g in advance, a map or table showing the relationship between the sensor output value Craw and the corrected threshold value CthR. The controller 17 may calculate the sensor output corrected value CrawR in reference to the map or table read from the memory 17g. This eliminates the need to calculate the corrected threshold value CthR using a theoretical equation (for example, exponential function). As a result, the calculating load on the controller 17 is reduced. The reduction in the calculating load on the controller 17 shortens the processing time of the controller 17, thereby shortening the sampling cycle. Alternatively, the reduction in the calculating load on the controller 17 downgrades the calculating performance of the controller 17, thereby reducing costs.

As another option, a table in which the corrected threshold value CthR gradually changes in correspondence with the sensor output value Craw may be used. This culls the data indicating the relationship between the sensor output value Craw and the corrected threshold value CthR, thereby reducing the storage capacity required for the memory 17g (the storage amount used in the memory 17g) requested by the memory 17g. In this case, the corrected threshold value CthR may be corrected through linear interpolation. This allows for accurate calculation of the corrected threshold value CthR from which the data has been culled.

In the second embodiment, the segments n may be obtained by dividing the entire range of any one of the corrected threshold value CthR, which correlates with the sensor output value Craw, the correction coefficient K, the resolution Res, and the capacitance C12. Alternatively, the segments n may be obtained by dividing the entire range of the reference sensor output value Cbase that is based on the previous sensor output value Craw. Further, the controller 17 may count, for each of the segments n, the number of times the corrected threshold value CthR, the correction coefficient K, the resolution Res, the capacitance C12, or the reference sensor output value Cbase has been determined as belonging to the segment n and store the result of counting the number of times in the memory 17g.

The invention claimed is:

1. A capacitance sensor comprising:
   a first capacitor and a second capacitor connected in series to a power supply;
   a first switch connected between two terminals of the first capacitor;
   a second switch connected between the first capacitor and the second capacitor;
   a third switch connected between two terminals of the second capacitor;
   a switch control unit configured to perform a first switching process that turns on the first switch and then repeatedly perform a second switching process that complementarily switches off and on the second switch and the third switch while turning off the first switch;
   an obtaining unit configured to calculate, as a sensor output value, a number of times the second switching process is repeated until a magnitude relationship reverses between an intermediate potential between the first and second capacitors and a reference potential that has been set in advance;
   a calculation unit configured to calculate a sensor output corrected value, the sensor output corrected value being obtained by correcting the sensor output value such that a resolution becomes uniform; and
   a determination unit configured to determine whether a detection target exists from a magnitude relationship between a sensor output difference value and a determination threshold value that has been set in advance, the sensor output difference value being a difference between a current one of the sensor output corrected value and a reference sensor output value that is based on a previous one of the sensor output corrected value.

2. The capacitance sensor according to claim 1, comprising:
   a segment determination unit configured to determine which one of segments the sensor output value belongs to, the segments being obtained by dividing an entire range of the sensor output value; and
   a memory configured to store a correction coefficient for each of the segments, the correction coefficient being used to correct the sensor output value, wherein
   the correction coefficient is set to a value proportional to a resolution of the sensor output value such that the resolution becomes uniform, and
   the calculation unit is configured to calculate the sensor output corrected value from the correction coefficient corresponding to the segment to which the sensor output value belongs.

3. The capacitance sensor according to claim 1, comprising:
   a segment determination unit configured to determine which one of segments the sensor output value belongs to, the segments being obtained by dividing an entire range of the sensor output value; and
   a segment counting unit configured to count, for each of the segments, a number of times the sensor output value has been determined as belonging to the segment;
   a memory configured to store a result of counting the number of times for each of the segments.

4. The capacitance sensor according to claim 3, wherein the segment counting unit is configured to update, when a result of determining the segment by the segment determination unit is switched, the number of times for a current one of the segments in which the determination result has been switched.

5. The capacitance sensor according to claim 1, wherein the calculation unit is configured to calculate the sensor output corrected value from the sensor output value in reference to a table that has been set in advance.

* * * * *